United States Patent
Yoon

(10) Patent No.: US 7,105,883 B2
(45) Date of Patent: Sep. 12, 2006

(54) SEMICONDUCTOR DEVICE

(75) Inventor: Dong-Soo Yoon, Kyoungki-do (KR)

(73) Assignee: Hynix Semiconductor Inc., Gyunggi-do (KR)

(*) Notice: Subject to any disclaimer, the term of this patent is extended or adjusted under 35 U.S.C. 154(b) by 0 days.

(21) Appl. No.: 10/739,234

(22) Filed: Dec. 18, 2003

(65) Prior Publication Data

US 2004/0129968 A1    Jul. 8, 2004

Related U.S. Application Data

(62) Division of application No. 10/222,684, filed on Aug. 16, 2002, now Pat. No. 6,706,627.

(30) Foreign Application Priority Data

Nov. 21, 2001    (KR) ................................ 2001-72621

(51) Int. Cl.
*H01L 21/8242* (2006.01)
*H01L 29/94* (2006.01)

(52) U.S. Cl. .................... 257/298; 257/306; 257/310

(58) Field of Classification Search ............... 257/298, 257/310; 365/65
See application file for complete search history.

(56) References Cited

U.S. PATENT DOCUMENTS

| | | | | |
|---|---|---|---|---|
| 5,668,040 A | * | 9/1997 | Byun | .................... 438/396 |
| 6,025,223 A | * | 2/2000 | Park | .................... 438/240 |
| 6,184,044 B1 | * | 2/2001 | Sone et al. | .................... 438/3 |
| 6,284,655 B1 | | 9/2001 | Marsh | .................... 438/681 |
| 6,320,213 B1 | | 11/2001 | Kirlin et al. | .................... 257/295 |
| 6,380,574 B1 | * | 4/2002 | Torii et al. | .................... 257/295 |
| 6,509,601 B1 | | 1/2003 | Lee et al. | .................... 257/310 |
| 6,600,183 B1 | | 7/2003 | Visokay et al. | .................... 257/295 |
| 6,900,498 B1 | * | 5/2005 | Stauf et al. | .................... 257/310 |
| 2001/0000923 A1 | * | 5/2001 | Takemura | .................... 257/532 |
| 2003/0042609 A1 | * | 3/2003 | Choi | .................... 257/758 |

FOREIGN PATENT DOCUMENTS

| | | | |
|---|---|---|---|
| EP | 337481 | * | 10/1989 |
| JP | 10-242409 | * | 9/1998 |
| KR | 2002-053967 | * | 7/2002 |
| KR | 2002-065246 | * | 8/2002 |

* cited by examiner

*Primary Examiner*—Leonardo Andujah
*Assistant Examiner*—Ahmed N. Sefer
(74) *Attorney, Agent, or Firm*—Marshall, Gerstein & Borun LLP

(57) ABSTRACT

A semiconductor device, including: a diffusion barrier layer composed of ternary compound elements formed on a substrate, wherein the diffusion barrier contains ruthenium, titanium and nitrogen; and a capacitor formed on the diffusion barrier layer, wherein the capacitor includes a bottom electrode formed on the diffusion barrier layer, a dielectric layer formed on the bottom electrode and a top electrode formed on the dielectric layer.

11 Claims, 1 Drawing Sheet

SEMICONDUCTOR DEVICE

This is a divisional of U.S. Ser. No. 10/222,684, filed Aug. 16, 2002 now U.S. Pat. No. 6,706,627, the entire disclosure of which is incorporated herein by reference.

BACKGROUND OF THE DISCLOSURE

1. Field of the Disclosure

The disclosure relates to a method for manufacturing a semiconductor device and a capacitor and, more particularly, to a method for manufacturing a diffusion barrier layer used in a capacitor.

2. Description of Related Art

In a dynamic random access memory (DRAM) and a ferroelectric RAM (FeRAM), a capacitor generally includes a bottom electrode, a high dielectric layer, and a top electrode.

Among various semiconductor memory devices, the DRAM is a memory device with excellent integration because one unit cell is composed of one transistor and one capacitor.

With progress of integration technology, the memory capacity of semiconductor device is increased about four times every three years. For example, 256 Mb DRAM and GB level of DRAM have been developed.

As integration of DRAM proceeds, a memory cell dimension is decreased gradually. For example, in the case of 256 Mb DRAM, the memory cell dimension is 0.5 $\mu m^2$, and, in this case, a capacitor dimension, which is one of basic element of a cell, may be smaller than 0.3 $\mu m^2$.

To obtain high capacitance in a small memory cell, numerous methods may be used. For example, the dielectric layer of the capacitor may be formed with a material having high dielectric constant, or the thickness of the dielectric layer is reduced, or the surface area of the capacitor is increased.

To increase the surface area of the capacitor, that is to increase the surface area of the charge storage electrode, there are provided numerous capacitor manufacturing technologies, such as stack-type capacitor or a trench-type capacitor formation technology, or a hemispherical polysilicon grain formation technology for forming the charge storage electrode. However, the above-mentioned technologies complicated capacitor structure, and the manufacturing process is very intricate, thereby increasing the cost of a product and decreasing the yield of the process.

Generally, $SiO_2/Si_3N_4$-based dielectric materials are used as the capacitor dielectric layer, and there exists a technological limit in the method for increasing capacitance by decreasing a thickness of a $SiO_2/Si_3N_4$-based dielectric layer.

Therefore, a method for capacitor manufacturing using high dielectric materials, such as $Ta_2O_5$, $SrBi_2Ta_2O_9$ (hereinafter, referred to as a SBT) having a perovskite structure, $Pb(Zr, Ti)O_3$ (hereinafter, referred to as a PZT) and $(Bi, La)_4Ti_3O_{12}$ (hereinafter, referred to as a BLT), which have higher dielectric constant than the $SiO_2/Si_3N_4$ based dielectric materials, are proposed.

Such high dielectric materials are used to increase memory device integration. With the use of high dielectric materials, the problem of bottom electrode oxidation is encountered. Therefore, research for forming the bottom electrode with a metal or a conductive oxide material, such as Pt, Ru, $RuO_2$, Ir and $IrO_2$, has been undertaken.

Meanwhile, to apply the above-mentioned metal or the conductive oxide material for forming the bottom electrode, a diffusion barrier layer is necessarily formed between the bottom electrode and a polysilicon plug for connecting the bottom electrode to a semiconductor substrate. A diffusion barrier layer may have good characteristics in preventing diffusion of oxygen generated in a dielectric formation process, which is processed in an $O_2$ atmosphere at a temperature of over 600° C.

Diffusion barrier layers formed in accordance with conventional methods are reactive with oxygen, nonconductive products are formed due to the oxidation of the diffusion barrier layer, and an erroneous operation of a capacitor is occurred.

SUMMARY OF THE DISCLOSURE

A semiconductor device comprising a barrier diffusion barrier capable of preventing oxygen diffusion is disclosed.

In accordance with one aspect of the disclosure, there is provided a semiconductor device, including: a diffusion barrier layer composed of ternary compound elements formed on a substrate, wherein the diffusion barrier contains ruthenium (Ru), titanium (Ti) and nitrogen (N); and a capacitor formed on the diffusion barrier layer, wherein the capacitor includes a bottom electrode formed on the diffusion barrier layer, a dielectric layer formed on the bottom electrode and a top electrode formed on the dielectric layer.

In accordance with another aspect of the disclosure, there is provided a method for manufacturing a semiconductor device, including the steps of: forming a diffusion barrier layer with ruthenium (Ru), titanium (Ti) and nitrogen (N) on a substrate; annealing the diffusion barrier layer; and forming a capacitor by stacking a bottom electrode, a dielectric and a top electrode on the diffusion barrier layer.

BRIEF DESCRIPTION OF THE DRAWINGS

Other aspects of the disclosure will become apparent from the following description of the embodiments with reference to the accompanying drawings, in which.

DETAILED DESCRIPTION OF THE DISCLOSURE

Hereinafter, a method for manufacturing a semiconductor device comprising a capacitor according to the disclosure will be described in detail referring to the accompanying drawings.

Figure 1:
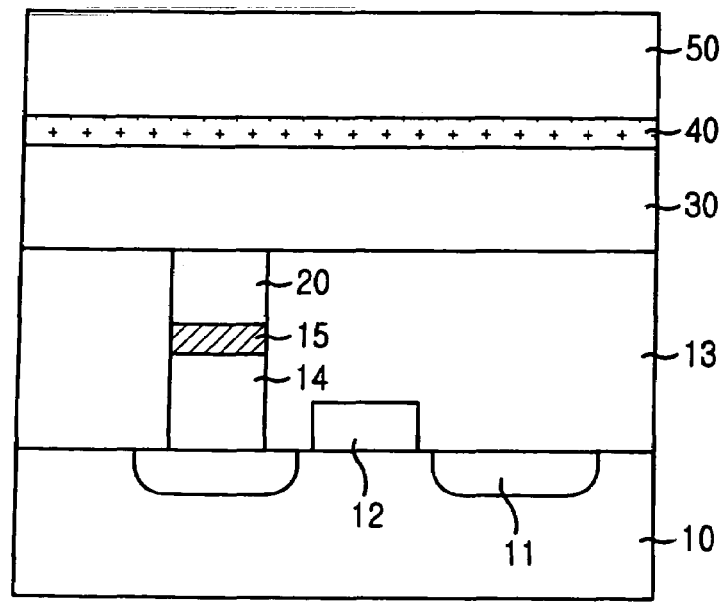
FIGS. 1 and 2 are cross-sectional views illustrating a semiconductor device including a capacitor in accordance with an embodiment of the disclosure.

Referring to FIG. 1, a semiconductor device includes a polysilicon plug 14 connected to a source/drain 11 of a transistor, and a titanium silicide 15 generated from the reaction of the polysilicon plug 14 and titanium deposited on the polysilicon plug 14. The semiconductor device also includes a diffusion barrier layer 20, which is composed of ternary compound elements, i.e., ruthenium-titanium-nitrogen, on the titanium silicide 15, and a capacitor having a bottom electrode 30, a dielectric layer 40, and a top electrode 50 stacked on the diffusion barrier layer 20.

The titanium silicide 15 prevents the diffusion of silicon from the polysilicon plug 14 to the bottom electrode 30. The dielectric layer 40 is formed with $Ta_2O_5$, $SrBi_2Ta_2O_9$ (SBT), $Pb(Zr, Ti)O_3$ (PZT), and $(Bi, La)_4Ti_3O_{12}$ (BLT), which have a perovskite structure. The top and bottom electrodes 50, 30 are formed with Ru, $RuO_2$, Ir, or $IrO_2$.

Figure 2:
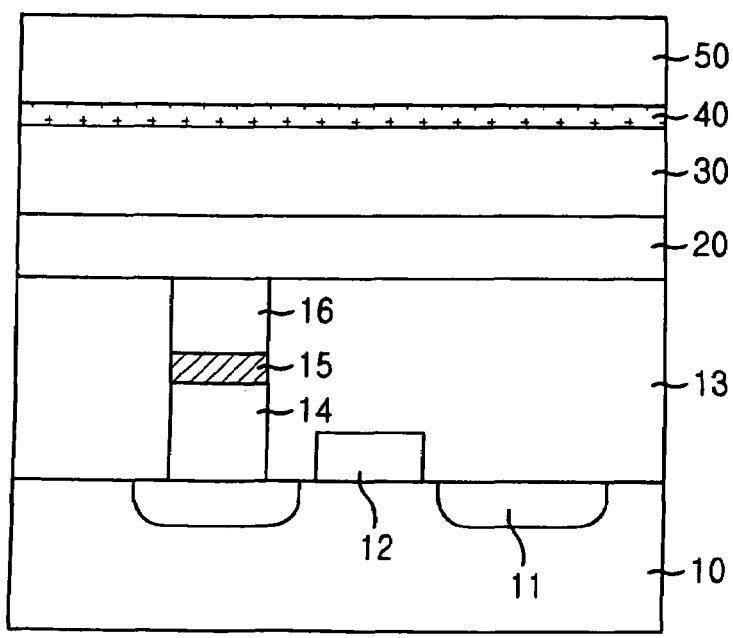

Referring to FIG. 2, a titanium nitride layer 16 is further formed on the titanium silicide 15, and a diffusion barrier layer 20, which is composed of ternary compound elements (i.e., ruthenium-titanium-nitrogen), is formed. An adhesive layer (not shown) may be formed on the diffusion barrier layer 20.

Hereinafter, a method for forming a diffusion barrier layer composed of ternary compound elements, i.e., ruthenium-titanium-nitrogen, in accordance with an embodiment of the disclosure will be described in detail.

In processes for forming a semiconductor device including a capacitor, a thermal treatment is carried out at a temperature of over 600° C., so oxygen in the dielectric layer 40 is diffused outwardly. Therefore, the diffusion barrier layer 40 should be able to prevent oxygen diffusion and, at the same time, should have a sufficient resistance to oxidation.

To prevent the oxidation of the diffusion barrier layer, there must be strong chemical combination between the materials that form the diffusion barrier layer. After reacting with oxygen, the diffusion barrier layer should remain conductive so not to bring about a problem that the capacitor does not operate.

To satisfy the above-mentioned conditions, as a base material for forming a diffusion barrier layer, Ru or Ir is adequate, because the oxidized substances of Ru and Ir are conductive oxide materials and have no problem in electrical connection.

Also, metals may be added to form a strong combination between elements in the diffusion barrier layer, and make an amorphous diffusion barrier layer. The added metals should have thermal stability and affinity to nitrogen. Refractory metals have these characteristics. Also, to obtain a strong chemical combination between the elements in the diffusion barrier layer, nitrogen should be added.

The diffusion barrier layer comprising refractory metals and nitrogen with Ir or Ru, may form an amorphous structure due to a strong chemical combination of the refractory metals and nitrogen, and an amorphous minimum structure can be maintained up to high temperature. Also, after oxidization with reactive oxygen, the electrical characteristics of a diffusion barrier layer may not deteriorate due to Ir or Ru.

In an embodiment of the disclosure, Ru is used as a base metal and Ti is used as the added refractory metal. The diffusion barrier layer is formed by a metal organic chemical vapor deposition (MOCVD) method using a Ru precursor and a Ti precursor.

A MOCVD method is used since, with minimization of a semiconductor device, a diameter of a storage node contact hole may be smaller about 0.1 μm², so an excellent gap-fill characteristic may not be obtained by using conventional physical vapor deposition (PVD).

The diffusion barrier layer may be formed using various types of reaction gas used in MOCVD method. In an embodiment of the disclosure $NH_3$ gas is used as the reaction gas.

A $RuX_2$ Ru precursor and a $TiX_4$ Ti precursor may be reacted according to the following equations.

The $NH_3$ reaction gas reacts with the Ru precursor and the Ti precursor, which make a layer containing Ru, Ti, and N. Reaction products including strongly volatile materials be easily removed with vacuum pumping. The following equations 1 and 2 show the respective reaction of $RuX_2$ or $TiX_4$ with $NH_3$.

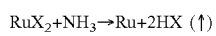  [Equation 1]

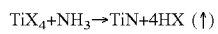  [Equation 2]

$RuX_3$ may also be used as a Ru precursor; in this case, $TiCl_4$ is used as a Ti precursor. The following equations 3 and 4 show the respective reaction of $RuX_3$ or $TiCl_4$ with $NH_3$.

  [Equation 3]

  [Equation 4]

Also, in this case, the $NH_3$ gas makes a layer containing Ru, Ti, and N by reacting with the Ru precursor and the Ti precursor, and the strongly volatile reaction products may be easily removed using vacuum pumping.

On the basis of the reaction principles, a detailed embodiment of a method for forming a diffusion barrier layer by a chemical vapor deposition (CVD) will be described.

First, the Ru precursor ($RuX_2$ or $RuX_3$) and the Ti precursor ($TiX_4$ or $TiCl_4$) are provided on a substrate heated to about 100° C. to about 900° C. with the $NH_3$ gas, in order that Ru and Ti may be absorbed to form a RuTiN layer on the surface of a substrate. The RuTiN layer is formed to a thickness of 200 Å to 1000 Å. In the RuTiN layer the concentration of Ru is about 50 at % to about 90 at %, the concentration of Ti is about 1 at % to about 50 at %, and the concentration of N is about 1 at % to about 80 at %.

If $RuX_2$ or $RuX_3$ is used as the Ru precursor, X is selected from the group consisting of H, $C_1$–$C_{10}$ alkyl, $C_2$–$C_{10}$ alkenyl, $C_1$–$C_8$ alkoxy, $C_6$–$C_{12}$ aryl, β-diketonates, cyclopentadienyl, $C_1$–$C_8$ alkylcyclopentadienyl and substances including halogen added thereof.

If $TiX_4$ or $TiCl_4$ is used as the Ti precursor, X is selected from the group consisting of H, $C_1$–$C_{10}$ alkyl, $C_2$–$C_{10}$ alkenyl, $C_1$–$C_8$ alkoxy, $C_6$–$C_{12}$ aryl, β-diketonates, cyclopentadienyl, $C_1$–$C_8$ alkylcyclopentadienyl and substances including halogen added thereto.

As the reaction gas, besides the $NH_3$ gas, nitrogen gas and a gas selected the group consisting of $O_2$, $H_2O$, $H_2O_2$, ROH, RCOOH and $C_2$–$C_{10}$ diol may be used, where R is selected from the group consisting of $C_1$–$C_{10}$ alkyl, $C_2$–$C_{10}$ alkenyl, $C_1$–$C_8$ alkoxy, $C_6$–$C_{12}$ aryl and substances inducing halogen added thereto.

A purge gas used in the MOCVD may be selected from the group consisting of $N_2$, He, Ne, Ar, $H_2$ and combinations thereof.

With the above-disclosed method, after depositing the diffusion barrier layer composed of ternary compound elements (ruthenium-titanium-nitrogen), various process may be adapted to improve the diffusion barrier layer. A process to make the surface of a diffusion barrier layer more dense using ion or plasma may be used, and in another process, oxygen may be added to a surface of a diffusion barrier layer followed by forming a uniform oxide layer.

Suitable methods may be described as follows.

First, the quality of a layer may be improved by adding oxygen on the surface of a diffusion barrier layer by carrying out a rapid thermal process (RTP) at a temperature of about 100° C. to about 650° C. for about 1 minute to about 5 minutes, in an atmosphere of $O_2$, a mixed gas of Ar and $O_2$, or a mixed gas of $N_2$ and $O_2$.

If oxygen is added at an atmosphere of a mixed gas of Ar and $O_2$ or a mixed gas of $N_2$ and $O_2$, a thermal treatment may be carried out with changing a composite ratio of Ar and $O_2$, or $N_2$ and $O_2$.

Besides the foregoing method, a useful method of improving the quality of the layer by making the surface of a diffusion barrier layer more dense and forming a uniform oxide layer uses an oxide ion. That is, oxygen ions are accelerated toward the substrate on which the diffusion barrier is formed, the surface of a diffusion barrier is contacted by the oxygen ions at a temperature of about 100° C. to about 650° C. for about 1 minute to about 5 minutes, in order to improve the surface density. In this manner, oxygen ions may be used to increase the surface density and to form a uniform oxide layer.

Ions other than oxygen ions may be used to increase the surface density of the diffusion barrier layer. For example, Ar or $N_2$ may be ionized in a chamber, and the surface of the diffusion barrier is contacted by the Ar or $N_2$ ions at a temperature of about 100° C. to about 650° C. for about 1 minute to 5 minutes, in order to increase the surface density. Thereafter, the surface of the diffusion barrier is treated with oxygen to form a uniform oxide layer. In this case, the oxygen may be ionized simultaneously with Ar and $N_2$, in order to increase the surface density of the diffusion barrier and to form a uniform oxide layer.

To improve the surface density using $NH_4$, a thermal treatment is carried out in an atmosphere of $NH_4$ or $NH_4$ plasma at a temperature of about 100° C. to about 650° C. for about 1 minute to about 15 minutes, and a uniform oxide layer is formed with oxygen ions. Also, a uniform oxide layer may be formed with oxygen ions after carrying out a thermal treatment using $NH_4$ plasma and oxygen plasma.

Instead of using $NH_4$ plasma or oxygen plasma, ultra violet (UV) radiation and ozone may be used to increase the surface density of the diffusion barrier layer and to form a uniform oxide layer. In this case, the processes are carried out at a temperature of about 100° C. to about 650° C. for about 1 minute to about 5 minutes.

The diffusion barrier layer in accordance with the disclosure may effectively prevent the diffusion of oxygen generated in processes, namely in a deposition process and in a post treatment process, for forming a high dielectric layer process. Therefore, it is possible to manufacture DRAM and FeRAM devices having excellent characteristics. Therefore, a capacitor having reliability and good electrical characteristic capacitor may be acquired and it may be used in a current and future semiconductor devices.

Although the preferred embodiments of the disclosure have been described for illustrative purposes, those skilled in the art will appreciate that various modifications, additions and substitutions are possible, without departing from the scope and spirit of the disclosure.

What is claimed is:

1. A semiconductor device, comprising:
  a conductive plug comprising a polysilicon plug, a titanium nitride layer, and a titanium silicide layer stacked on a substrate with the titanium silicide layer disposed between the polysilican plug and the titanium nitride layer;
  a diffusion barrier layer composed of tertiary compound elements including ruthenium (Ru), titanium (Ti), and nitrogen (N) formed on the titanium nitride layer by a surface treatment, wherein the diffusion barrier layer exhibits increased surface density by effectively preventing diffusion of oxygen; and
  a capacitor formed on the diffusion barrier layer, wherein the capacitor includes a bottom electrode formed on the diffusion barrier layer, a dielectric layer formed on the bottom electrode and a top electrode formed on the dielectric layer.

2. The semiconductor device of claim 1, wherein the diffusion barrier layer comprises Ru: about 50 to about 90 atom %; Ti: about 1 to about 50 atom %; and N: about 1 to about 80 atom %.

3. The semiconductor device of claim 1, wherein a thickness of the diffusion barrier layer is 200 Å~1000 Å.

4. The semiconductor device of claim 1, wherein the diffusion barrier layer further includes an oxide layer on the surface thereof.

5. The semiconductor device of claim 1, wherein the diffusion barrier layer is formed with a $RuX_2$ precursor and a $TiX_4$ precursor, wherein X is selected from the group consisting of H, $C_1$–$C_{10}$ alkyl, $C_2$–$C_{10}$ alkenyl, $C_1$–$C_8$ alkoxy, $C_6$–$C_{12}$ aryl, β-diketonates, cyclopentadienyl, $C_1$–$C_8$ alkylcyclopentadienyl and substances including halogen added thereto.

6. The semiconductor device of claim 1, the diffusion barrier layer is formed with a $RuX_3$ precursor and a $TiCl_4$ precursor, wherein X is selected from the group consisting of H, $C_1$–$C_{10}$ alkyl, $C_2$–$C_{10}$ alkenyl, $C_1$–$C_8$ alkoxy, $C_6$–$C_{12}$ aryl, β-diketonates, cyclopentadienyl, $C_1$–$C_8$ alkylcyclopentadienyl and substances including halogen added thereto.

7. The semiconductor device of claim 1, wherein the surface treatment comprises using a purge gas selected from the group consisting of $N_2$, He, Ne, Ar, $H_2$ and a combination vapor thereof.

8. The semiconductor device of claim 1, wherein the surface treatment comprises forming the diffusion barrier with a reaction gas selected from the group consisting of $O_2$, $NH_3$, $H_2O$, $H_2O_2$, ROH, RCOOH and $C_2$–$C_{10}$ diol, wherein R is selected from the group consisting of $C_1$–$C_{10}$ alkyl, $C_2$–$C_{10}$ alkenyl, $C_1$–$C_8$ alkoxy, $C_6$–$C_{12}$ aryl and substances including halogen added thereto.

9. The semiconductor device of claim 1, wherein the surface treatment comprises annealing the diffusion barrier with a rapid thermal process (RTP) at a temperature of 100° C.~650° C. for about one minute to five minutes.

10. The semiconductor device of claim 9, wherein the surface treatment comprises performing RTP in an atmosphere selected from the group consisting of of $O_2$, mixed gas of Ar and $O_2$, and mixed gas of $N_2$ and $O_2$.

11. The semiconductor device of claim 1, wherein the surface treatment is performed with oxygen ions, $NH_4$ gas, $NH_4$ plasma, oxygen plasma, or mixed ions of oxygen and nitrogen.

* * * * *

UNITED STATES PATENT AND TRADEMARK OFFICE
CERTIFICATE OF CORRECTION

PATENT NO. : 7,105,883 B2
APPLICATION NO. : 10/739234
DATED : September 12, 2006
INVENTOR(S) : Dong-Soo Yoon Page 1 of 1

It is certified that error appears in the above-identified patent and that said Letters Patent is hereby corrected as shown below:

In the Claims:

In Column 5, line 50, "polysilican" should be -- polysilicon --.

In Column 5 , line 52, "tertiary" should be -- ternary --.

In Column 6, line 48, "consisting of of $O_2$" should be -- consisting of $O_2$ --.

In Column 6, line 52, "$NH_4$, plasma" should be -- $NH_4$ plasma --.

Signed and Sealed this

Twenty-eighth Day of August, 2007

JON W. DUDAS
*Director of the United States Patent and Trademark Office*